(12) United States Patent
Hosokawa

(10) Patent No.: US 8,924,220 B2
(45) Date of Patent: Dec. 30, 2014

(54) MULTIBAND COMPRESSOR

(75) Inventor: Satoshi Hosokawa, Tokyo (JP)

(73) Assignee: Lenovo Innovations Limited (Hong Kong), Quarry Bay (HK)

( * ) Notice: Subject to any disclaimer, the term of this patent is extended or adjusted under 35 U.S.C. 154(b) by 0 days.

(21) Appl. No.: 13/502,280

(22) PCT Filed: Sep. 7, 2010

(86) PCT No.: PCT/JP2010/005483
§ 371 (c)(1),
(2), (4) Date: Apr. 16, 2012

(87) PCT Pub. No.: WO2011/048741
PCT Pub. Date: Apr. 28, 2011

(65) Prior Publication Data
US 2012/0209616 A1 Aug. 16, 2012

(30) Foreign Application Priority Data

Oct. 20, 2009 (JP) ................. 2009-241033

(51) Int. Cl.
G10L 19/00 (2013.01)
H03G 9/02 (2006.01)
H04R 25/00 (2006.01)

(52) U.S. Cl.
CPC ............ H03G 9/025 (2013.01); H04R 2430/03 (2013.01); H04R 25/356 (2013.01)
USPC ........... 704/500; 704/501; 704/270; 704/233; 704/231; 704/225; 704/219; 704/208; 704/202; 381/94.7; 381/94.3; 381/320; 381/318; 381/317; 381/106; 381/103; 379/347; 375/148; 341/50

(58) Field of Classification Search
USPC ......... 704/9, 4, 501, 500, 270, 233, 231, 225, 704/219, 208, 202; 381/94.7, 94.3, 320, 381/318, 317, 106, 103; 379/347; 375/148; 341/50
See application file for complete search history.

(56) References Cited

U.S. PATENT DOCUMENTS 4,882,762 A * 11/1989 Waldhauer ..................... 381/106
4,996,712 A *  2/1991 Laurence et al. ............. 381/320
5,335,312 A *  8/1994 Mekata et al. ................ 704/202

(Continued)

FOREIGN PATENT DOCUMENTS

CN          1689251       10/2005
CN         101258773       9/2008

(Continued)

OTHER PUBLICATIONS

International Search Report, PCT/JP2010/005483, Oct. 5, 2010.

(Continued)

Primary Examiner — Michael Colucci
(74) Attorney, Agent, or Firm — Young & Thompson

(57) ABSTRACT

In a multiband compressor 100, a level calculation unit 121 calculates a signal level inputted for each of bands, a gain calculation unit 122 calculates a gain value from the calculated signal level, and a gain limitation unit 130 limits a gain value by comparison with a gain value of the other band in a compressor for each band. With this configuration, provided is a multiband compressor capable of achieving a balance between the quality of sound and the effect of enhancing the sound level at a high level.

2 Claims, 5 Drawing Sheets

(56) References Cited

U.S. PATENT DOCUMENTS

| | | | |
|---|---|---|---|
| 5,745,586 A * | 4/1998 | Tagami et al. | 381/103 |
| 5,838,598 A * | 11/1998 | Hurrell | 708/300 |
| 5,896,449 A * | 4/1999 | Oshidari et al. | 379/347 |
| 6,144,937 A * | 11/2000 | Ali | 704/233 |
| 6,345,246 B1 * | 2/2002 | Moriya et al. | 704/219 |
| 6,377,916 B1 * | 4/2002 | Hardwick | 704/208 |
| 6,732,073 B1 * | 5/2004 | Kluender et al. | 704/233 |
| 6,801,895 B1 * | 10/2004 | Huang et al. | 704/270 |
| 7,039,095 B2 * | 5/2006 | Takahashi | 375/148 |
| 7,069,212 B2 * | 6/2006 | Tanaka et al. | 704/225 |
| 8,107,657 B2 * | 1/2012 | Hansen | 381/317 |
| 8,396,717 B2 * | 3/2013 | Oshikiri | 704/501 |
| 2002/0015503 A1 * | 2/2002 | Hou | 381/94.3 |
| 2003/0177006 A1 * | 9/2003 | Ichikawa et al. | 704/231 |
| 2004/0057586 A1 * | 3/2004 | Licht | 381/94.7 |
| 2005/0231396 A1 * | 10/2005 | Dunn | 341/50 |
| 2006/0165199 A1 | 7/2006 | Takemoto et al. | |
| 2008/0144869 A1 | 6/2008 | Paludan-Mueller et al. | |
| 2008/0298615 A1 * | 12/2008 | Klinkby et al. | 381/318 |
| 2010/0250260 A1 * | 9/2010 | Laaksonen et al. | 704/500 |

FOREIGN PATENT DOCUMENTS

| | | |
|---|---|---|
| JP | 09-056000 | 2/1997 |
| JP | 10-200996 | 7/1998 |
| JP | 2000-022473 | 1/2000 |
| JP | 2000-022743 A | 1/2000 |
| JP | 2000-278786 | 10/2000 |
| JP | 2006-203683 | 8/2006 |
| JP | 2009-507407 | 2/2009 |
| JP | 2009077378 A | 4/2009 |

OTHER PUBLICATIONS

CN Office Action dated Nov. 12, 2013, with English translation; Application No. 201080047675.1.

CN Office Action dated May 6, 2014, with English Translation; Application No. 201080047675.1.

Japanese Office Action dated Jun. 3, 2014; Publication No. 2011-537106.

Japanese Office Action dated Jun. 3, 2013; Publication No. 2011-537106.

* cited by examiner

FIG. 3
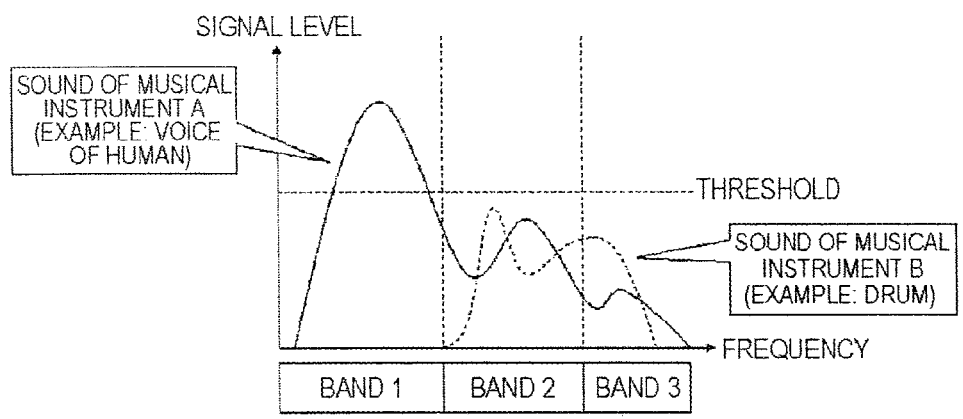
(a) ORIGINAL SIGNAL
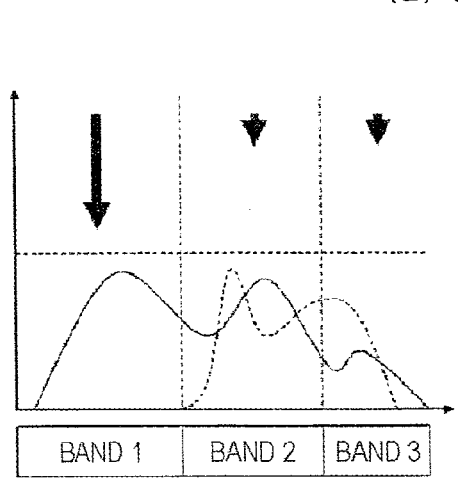
(b) CONVENTIONAL ART
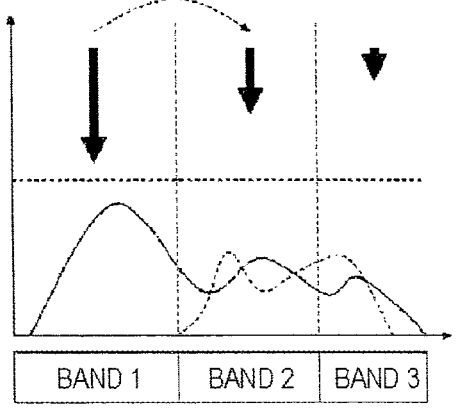
(c) PRESENT INVENTION

MULTIBAND COMPRESSOR

TECHNICAL FIELD

The present invention relates to a multiband compressor that splits an audio signal by frequency bands, subjects each of the split audio signals to a dynamics compression process for each of the frequency bands, synthesizes the subjected audio signals, and outputs the synthesized audio signal.

BACKGROUND ART

FIG. 4 illustrates a configuration of a typical multiband compressor. The multiband compressor provides a sound process of splitting an inputted audio signal with a band splitting filter (also referred to as isolator) by frequency bands, applying a compressor process for each of the split frequency bands, synthesizing the split audio signals, and outputting the synthesized audio signal.

The compressor process provides a function of measuring levels of an inputted signal, subjecting the inputted signal to a weighting process in accordance with a sound level curve as illustrated in FIG. 5, and outputting the subjected signals. A boundary level of an input signal called a threshold is given in advance, and the sound level is reduced in accordance with the designated amount of compression when the sound level more than or equal to the threshold is inputted.

By applying the output gains by the amount corresponding to the reduction in the sound level from the maximum input, it is possible to obtain an effect of enhancing the average sound level throughout the entire compressor. The multiband compressor performs the compressor process separately for each frequency band. Thus, in the case where the sound level of one frequency band suddenly changes, this sudden change does not have any effect on the other frequency bands.

In the case where a sound contains plural sound sources (general music), it is possible to avoid unnatural sound fluttering, and to sufficiently obtain the effect of enhancing the sound level. As the multiband compressor as described above, there have been various propositions (see, for example, Patent Documents 1 to 3).

RELATED DOCUMENT

Patent Documents

Patent Document 1: Japanese Patent Application Laid-open No. 2000-022473
Patent Document 2: Japanese Patent Application Laid-open No. 2000-278786
Patent Document 3: Japanese Patent Application (Translation of PCT Application) Laid-open No. 2009-507407

SUMMARY OF INVENTION

However, the typical multiband compressor operates the compressors separately for each band, causing the following problems.

(1) In the case where the fundamental frequency and the harmonic component of the input signal are divided separately to different bands, only the fundamental frequency having relatively high level is compressed, resulting in loss of balance of the sound (change of characteristics of the sound).

(2) The effect of enhancing the sound level varies depending on frequency bands, possibly causing a case where only the high-frequency band or low-frequency band is enhanced, resulting in the unpleasant output sound. This is particularly prominent when only the high frequency band is enhanced.

These problems result from the intrinsic characters of the multiband compressor, and is in the relationship of trade-off with the effect of enhancing the sound level. Thus, with the general types of devices, which receive various kinds of signals, the effect of enhancing the sound level is required to be suppressed in a certain degree.

The present invention has been made in view of the problems described above, and provides a multiband compressor capable of obtaining the maximum effect of enhancing the sound level while maintaining the quality of sound.

A multiband compressor according to the present invention splits an audio signal by plural frequency bands, subjects the audio signal to a dynamics compression process for each of the frequency bands, synthesizes the subjected audio signals, and outputs the synthesized audio signal, and includes a level calculation unit that calculates a signal level inputted for each of the plural bands; a gain calculation unit that calculates a gain value from the calculated signal level; and a gain limitation unit that limits the gain value by comparison with a gain value of the other band in a compressor of each of the plural bands According to the multiband compressor of the present invention, the level calculation unit calculates a signal level inputted for each of the bands; the gain calculation unit calculates the gain value from the calculated signal level; and the gain limitation unit applies limitation to the gain value by comparison with a gain value of the other band in a compressor of each of the plural bands. Thus, it is possible to achieve the balance between the quality of the sound and the effect of enhancing the sound level at a high level.

BRIEF DESCRIPTION OF THE DRAWINGS

The above-described object and other objects of the present invention, and features and advantages of the present invention will be made further clear by the preferred exemplary embodiment described below and the following drawings attached thereto.

FIG. 3 is a characteristic view illustrating frequency and average level obtained from several music contents;

DESCRIPTION OF EXEMPLARY EMBODIMENTS

Hereinbelow, an exemplary embodiment of the present invention will be described with reference to FIG. 1 to FIG. 3. A multiband compressor 100 according to this exemplary embodiment divides an audio signal by frequency bands, subjects the divided audio signals to a dynamics compression process for each of the frequency bands, synthesizes the subjected signals, and outputs the synthesized signal.

The multiband compressor 100 according to this exemplary embodiment has a level calculation unit 121 that calculates a signal level inputted for each of the frequency bands, a gain calculation unit 122 that calculates a gain value from the calculated signal level, and an interband limiter 130 serving as a gain limitation unit that limits a gain value by comparison with a gain value of the other band in a compressor provided for each of the bands.

Figure 1:
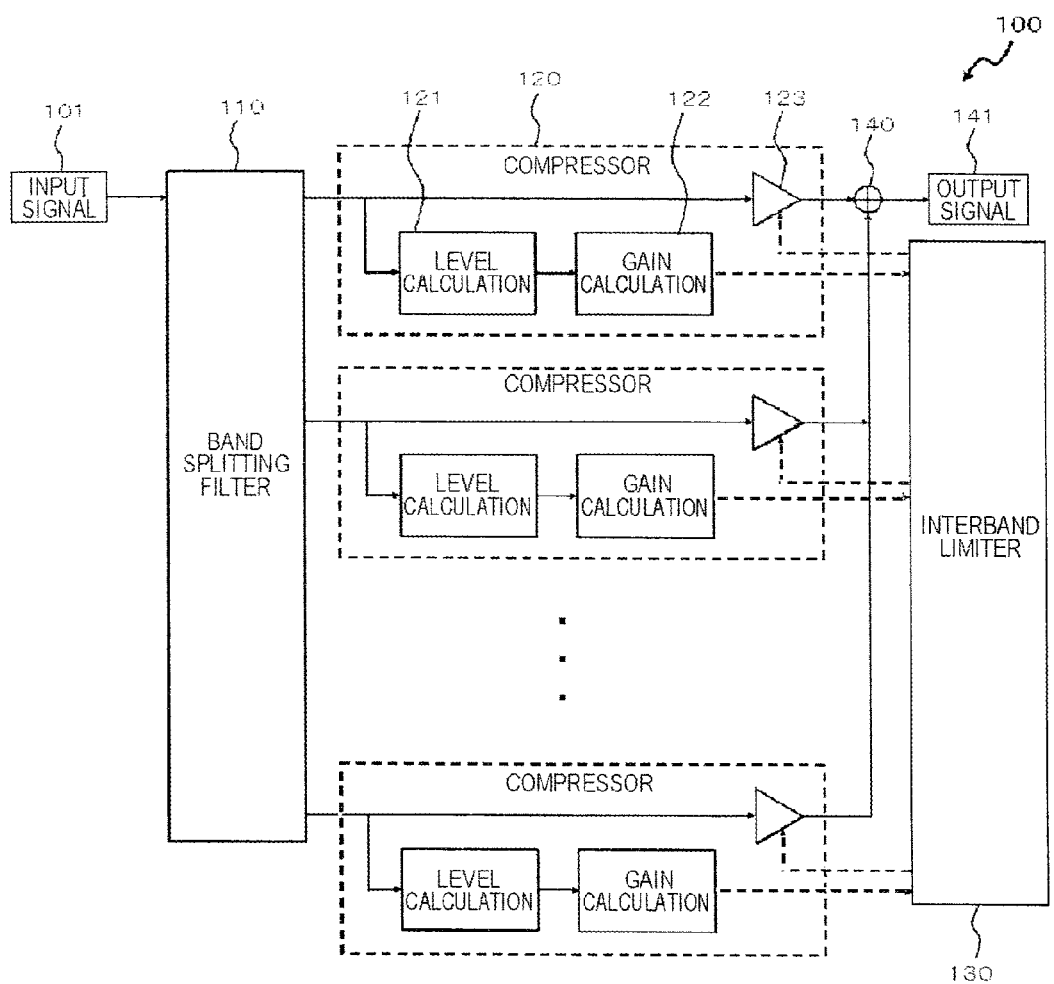
FIG. 1 is a block diagram illustrating a multiband compressor according to an exemplary embodiment of the present invention.

More specifically, as illustrated in FIG. 1, in the multiband compressor 100 according to this exemplary embodiment, plural compressors 120 are connected in parallel to a band splitting filter 110 receiving an input signal 101.

The compressors 120 each have the level calculation unit 121 and the gain calculation unit 122. The level calculation unit 121 and the gain calculation unit 122 are connected to each other in series. The gain calculation units 122 of the respective compressors 120 are connected to the interband limiter 130.

The compressors 120 each have a variable volume 123 connected to the band splitting filter 110, and the variable volumes 123 of the compressors 120 are connected to the interband limiter 130 in a feedback manner. The outputs of the variable volumes 123 of the respective compressors 120 are sent to one adder 140, and the adder 140 outputs an added signal 141.

With the multiband compressor 100 according to this exemplary embodiment having the configuration as described above, the results of the gain calculations for the respective bands are sent to the interband limiter 130 that processes the results of the gain calculations, and then the processed gain value is applied to a signal.

The interband limiter 130 receives the gain values of the respective bands as input, compares the gain values between the respective bands, applies correction, and outputs the gain value. The interband limiter 130 may have any configuration, and examples thereof will be described below.

Figure 2:
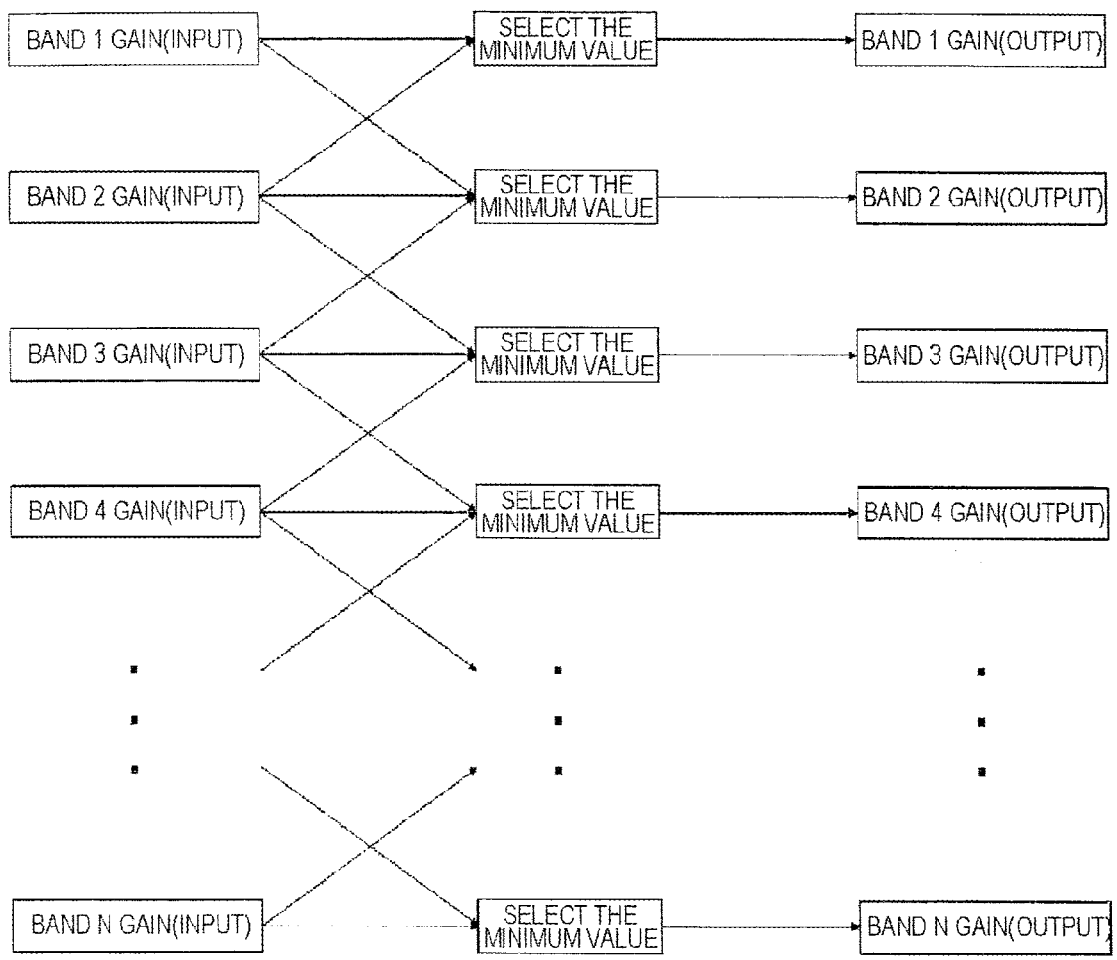
FIG. 2 is a characteristic view illustrating frequency and signal level in an example of an adjustment method.
Figure 4:
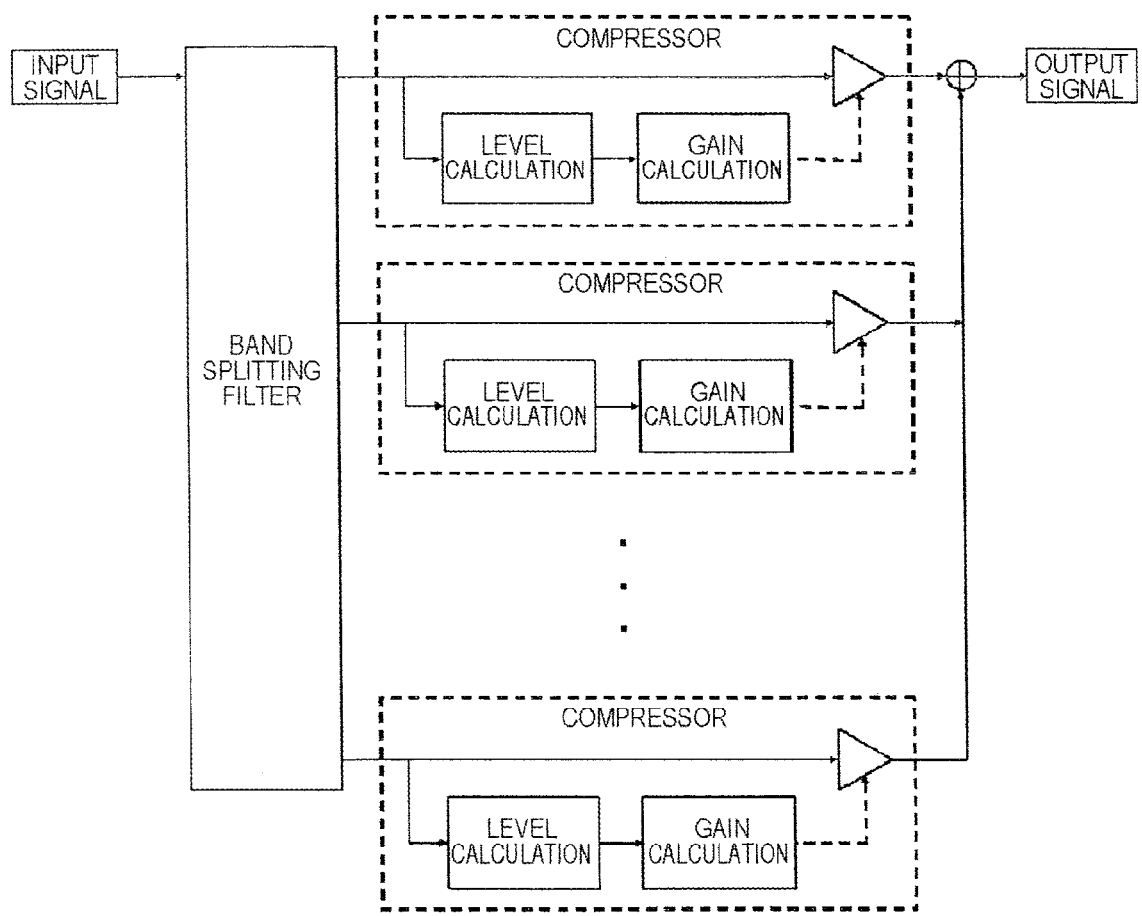
FIG. 4 is a block diagram illustrating an example of a conventional multiband compressor.
Figure 5:
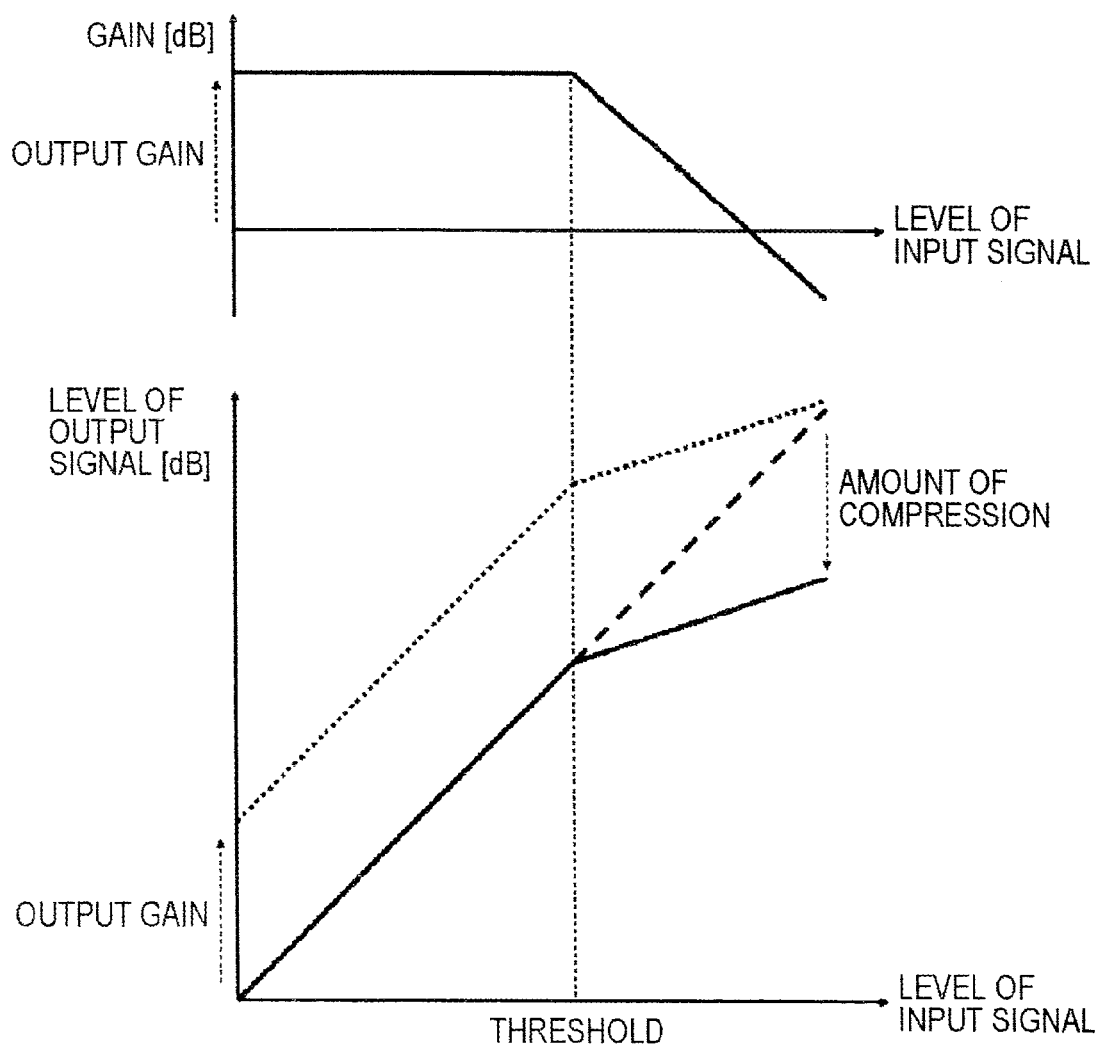
FIG. 5 is a characteristic view illustrating threshold and signal level of an example of a conventional multiband compressor.

(1) As illustrated in FIG. 2, for example, selecting the minimum gain value among the target band and the adjacent band.

(2) Multiplying a difference between the gain value of a nearby band and the gain value of the target band by a weight coefficient, obtaining the sum total thereof, and adding the sum total to the gain value of the target band to apply correction.

(3) Limiting in a manner such that the gain value on the high band side does not exceed the gain value on the lower band side.

With reference to FIG. 3, operations according to the present example will be described. In this specification, an operation employing the interband limiter having the configuration of the (2) above will be described as an example. Further, in order to facilitate understanding, only the effect obtained by the amount of compression will be described, and an explanation of the amount of increase obtained by the output gain is omitted.

FIG. 3(*a*) illustrates a distribution of frequencies of the input signal. As an example, the drawing illustrates a case where sound is produced at the same time by a musical instrument A having the fundamental frequency on the lower frequency band side and a musical instrument B having the fundamental frequency on the middle frequency band side.

As illustrated in FIG. 3(*b*), the conventional typical multi-band compressor performs the compression operation independently for each band. Thus, compression is applied only to a band 1 (lower frequency band) in which the signal exceeding the threshold is inputted, and is not applied to the other bands, and the sound levels of the other bands remain unchanged. This leads to a large loss of balance between the fundamental frequency and the harmonic component in terms of the sound of the musical instrument A, and it is anticipated that the thus obtained sound is recognized to have a totally different sound quality.

On the other hand, in the operation of the present invention illustrated in FIG. 3(*c*), compression is applied to the band 2 (middle frequency band) in a certain degree in response to the compression applied to the band 1 (lower frequency band), thereby minimizing the change of the quality of the sound generated from the musical instrument A.

Compression of the band 2 (middle frequency band) may have a little effect on the sound quality of the musical instrument B. However, the difference in the gain value from the band 3 (high frequency band) is not large, and hence, the change in the sound level is minimum.

As can be understood from the examples described above, the multiband compressor 100 according to this exemplary embodiment solves the following problems related to the multiband compressor by applying limitation on the operation between the bands.

(1) In the case where an input signal is inputted in such a manner that the fundamental frequency and the harmonic component of the input signal are divided separately to different bands, only the fundamental frequency having the relatively large level is compressed, which leads to a loss of balance of the sound (change of characters of the sound).

(2) The effect of enhancing the sound level varies depending on the frequency bands. This may cause a case where only the high frequency band or low frequency band is enhanced, possibly causing the unpleasant sound to be outputted. This is particularly prominent when only the high frequency band is enhanced.

With the multiband compressor 100 according to this exemplary embodiment, it is still possible to avoid unnecessary compression performed in response to signals of the distant frequency. Thus, the multiband compressor 100 according to this exemplary embodiment still holds superiority in enhancing the sound level for the compressor of one single band.

As described above, it is possible to achieve the balance between the quality of sound and the effect of enhancing the sound level at a high level. Note that the present invention is not limited to this exemplary embodiment, and various modification may be possible with in the scope of the present invention.

The present application claims priority based on Japanese Patent Application No. 2009-241033 filed in Japan on Oct. 20, 2009, all of which disclosure is incorporated herein by reference.

The invention claimed is:

1. A multiband compressor that splits an audio signal by plural frequency bands, subjects the audio signal to a dynamics compression process for each of the frequency bands, synthesizes the subjected audio signal, and outputs the synthesized audio signal, comprising
a level calculation unit that calculates a signal level inputted for each of the bands;
a gain calculation unit that calculates a gain value from the calculated signal level; and
a gain limitation unit that limits the gain value by comparison with a gain value of the other band in a compressor of each of the bands,
wherein the gain limitation unit multiplies a difference in the gain values between the band to be processed and a nearby band by a weight coefficient, obtain a sum total thereof, and adds the sum total to the gain value of the band to be processed.

2. The multiband compressor according to claim 1, wherein the gain limitation unit limits the gain value in such a manner that the gain value on a high frequency band side is less than or equal to the gain value on a lower frequency band side.

\* \* \* \* \*